(12) United States Patent
Hsieh et al.

(10) Patent No.: US 8,866,523 B2
(45) Date of Patent: Oct. 21, 2014

(54) METHOD AND ASSOCIATED APPARATUS FOR CLOCK-DATA EDGE ALIGNMENT

(71) Applicant: MStar Semiconductor, Inc., Hsinchu Hsien (TW)

(72) Inventors: Ming-Yu Hsieh, Taichung (TW); Sheng-Che Tseng, Hsinchu Hsien (TW); Chih-Ming Hung, Mckinney, TX (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/872,287

(22) Filed: Apr. 29, 2013

(65) Prior Publication Data

US 2013/0300478 A1 Nov. 14, 2013

(30) Foreign Application Priority Data

May 11, 2012 (TW) .............................. 101116944 A (51) Int. Cl.
*H03L 7/00* (2006.01)
(52) U.S. Cl.
CPC ......................................... *H03L 7/00* (2013.01)
USPC ........... 327/161; 327/164; 327/261; 327/269; 327/270

(58) Field of Classification Search
CPC ............ G11C 7/22; G11C 7/222; H03K 5/15; H03L 7/00; H03L 7/0814
USPC .......................... 327/161, 164, 261, 269, 270
See application file for complete search history.

(56) References Cited

U.S. PATENT DOCUMENTS

2009/0243677 A1* 10/2009 Becker et al. ................. 327/158

\* cited by examiner

*Primary Examiner* — John Poos
(74) *Attorney, Agent, or Firm* — Edell, Shapiro & Finnan, LLC (57) ABSTRACT

An edge alignment apparatus includes: a signal source, for generating a first and a second square wave signals; a phase delay circuit, for receiving the first and the second square wave signals to generate a delayed first and a delayed second square wave signals; a data circuit, for generating a third square wave signal according to the delayed second square wave signal; and a phase calibrating circuit, for receiving the third square wave signal and the delayed first squared wave signal to generate at least one phase tuning signal to the phase delay circuit for tuning a phase difference between the delayed first and the delayed second square wave signals, such that a signal edge of the third square wave signal aligns with that of the first square wave signal. The first, second and third square wave signals have a same frequency.

16 Claims, 9 Drawing Sheets

METHOD AND ASSOCIATED APPARATUS FOR CLOCK-DATA EDGE ALIGNMENT

This application claims the benefit of Taiwan application Serial No. 101116944, filed May 11, 2012, the subject matter of which is incorporated herein by reference.

BACKGROUND OF THE INVENTION

1. Field of the Invention

The invention relates in general to a method and associated apparatus for signal control, and more particularly to a method and associated apparatus for clock-data edge alignment.

2. Description of the Related Art

Figure 1:
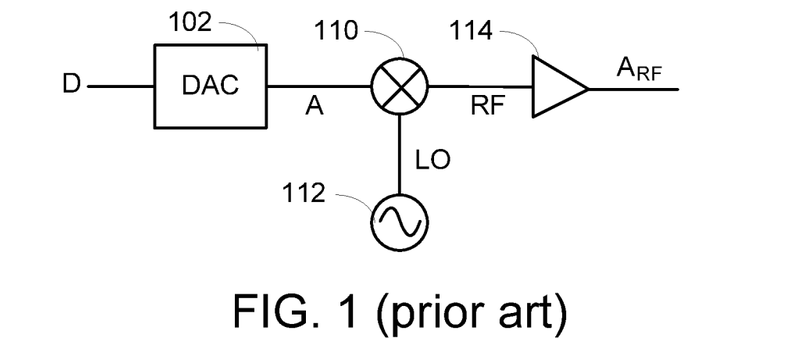
FIG. 1 (prior art) is a schematic diagram of a conventional transmitter.

FIG. 1 shows a schematic diagram of a conventional signal transmitter. In the transmitter, a digital signal D in a KHz level is converted by a digital-to-analog converter (DAC) 102 into an analog signal A, which is then inputted into a mixer 110. Through a local oscillation (LO) signal generated by a local oscillator 112, the analog signal A inputted into the mixer 110 is up-converted to a radio-frequency (RF) signal in a level of GHz, which is then amplified by a high-output frequency amplifier 114 and outputted as an amplified RF signal $A_{RF}$.

Figure 2:
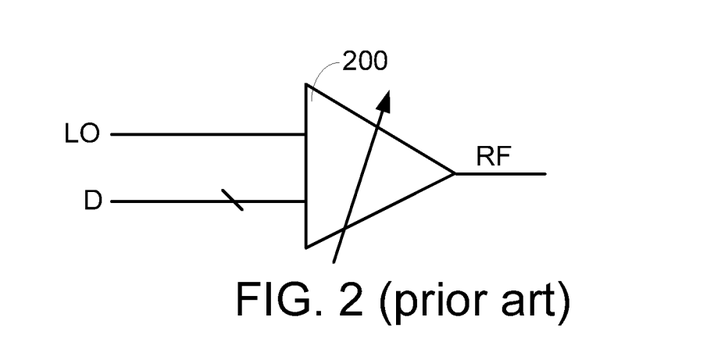
FIG. 2 (prior art) is a schematic diagram of a radio-frequency digital-to-analog converter (RFDAC)

A radio-frequency digital-to-analog converter (RFDAC), or referred to as a digital power amplifier, is now available for replacing functions of the above signal transmitter to directly generate a large-power RF signal. FIG. 2 shows a schematic diagram of an RFDAC. An RFDAC 200 includes an input as an N-bit digital signal D bus and an LO input. All input signals including the N-bit digital signal D and the LO signal are fundamentally GHz signals, according to which the RFDAC 200 is capable of generating an RF signal.

In addition to having the same frequency, signal edges between all of the input signals also need to be aligned to prevent output power degradation and noise increase in the RFDAC 200. Therefore, there is a need for a solution capable of effectively aligning signal edges between the input signals.

SUMMARY OF THE INVENTION

An edge alignment apparatus is provided by the present invention. The edge alignment apparatus comprises a signal source, for generating a first square wave signal and a second square wave signal; a phase delay circuit, for receiving the first square wave signal and the second square wave signal to generate a delayed first square wave signal and a delayed second square wave signal; a data circuit, for generating a third square wave signal according to the delayed second square wave signal; and a phase calibrating circuit, for receiving the third square wave signal and the delayed first squared wave signal to generate at least one phase tuning signal to the phase delay circuit for tuning a phase difference between the delayed first and the delayed second square wave signals, such that a signal edge of the third square wave signal aligns with a signal edge of the first square wave signal. The first, second and third square wave signals have a same frequency.

An edge alignment method, for aligning signal edges of a delayed first square wave signal and a delayed second square wave signal, is further provided by the present invention. The method comprises steps of: a) receiving a first square wave and a second square wave; b) generating a delayed first square wave and a delayed second square wave according to at least one phase tuning signal; c) sampling the delayed second square wave signal according to the delayed first square wave signal to generate a sampling signal; and d) changing the at least one phase tuning signal when a bitstream in the sampled signal is not a metadata and returning to step (b), and stopping changing the at least one phase tuning signal when the bitstream is the metadata.

An edge alignment method, for aligning signal edges of a delayed first square wave signal and a delayed second square wave signal, is further provided by the present invention. The method comprises steps of: receiving a first square wave and a second square wave; generating a delayed first square wave and a delayed second square wave according to at least one phase tuning signal; sampling the delayed second square wave signal according to the delayed first square wave signal to generate a sampling signal; and determining a first state or a second state when a bitstream in the sampling signal is not a metadata, or determining a third state when the bitstream is the metadata. In accordance with this embodiment, the at least one phase tuning signal comprises N bits, and a plurality of third states are obtained after changing the at least one phase tuning signal $2^N$ times, and an optimal phase tuning signal is determined from a plurality of phase tuning signals corresponding to the third states.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3A:
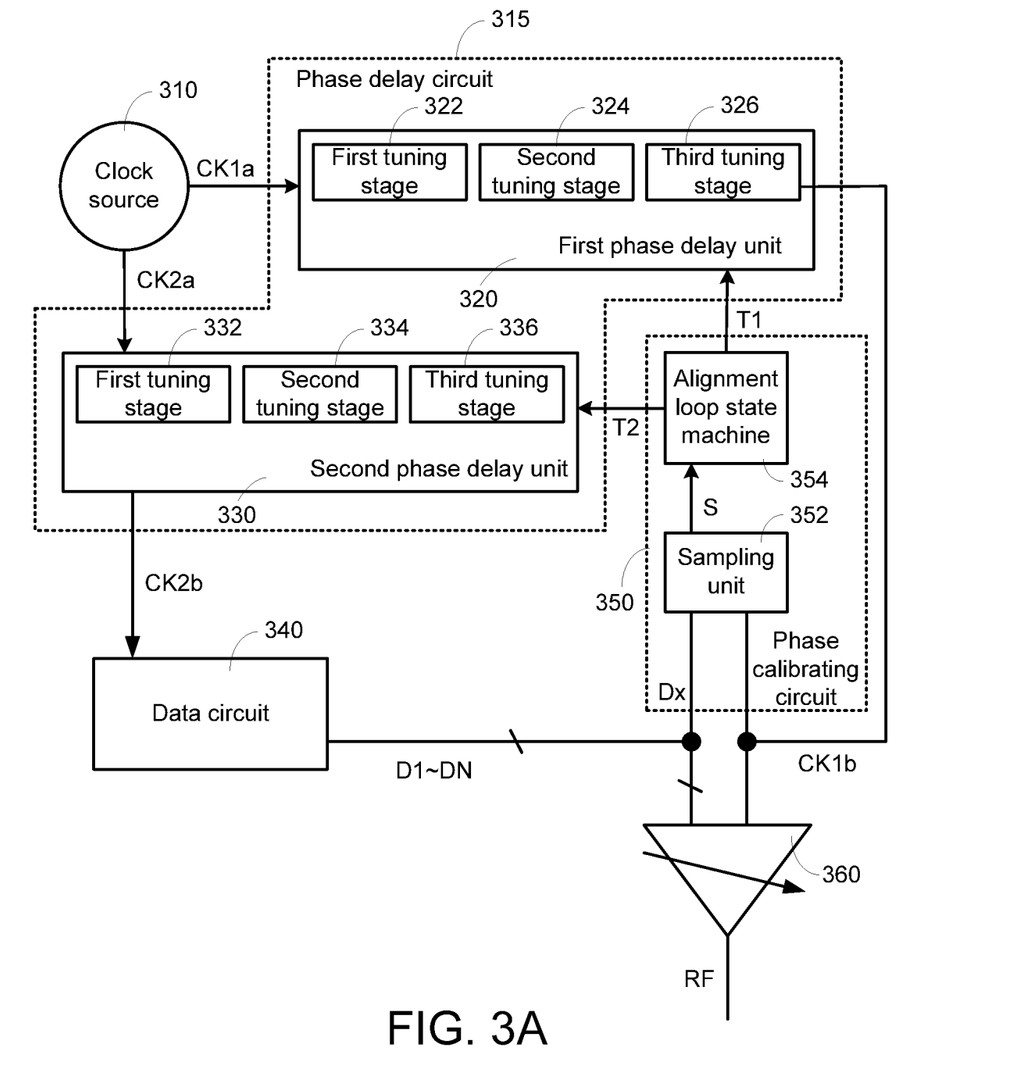
FIGS. 3A to 3C are respectively a clock-data signal edge alignment apparatus according to first to third embodiments of the present invention.

FIG. 3A shows a clock-data signal edge alignment apparatus according to a first embodiment of the present invention. The edge alignment apparatus calibrates the signal edge of all input signals inputted into a radio-frequency digital-to-analog converter (RFDAC) 360. The edge alignment apparatus comprises a clock source 310, a phase delay circuit 315, a data circuit 340 and phase calibration circuit 350. The phase delay circuit 315 comprises a first phase delay unit 320 and a second phase delay unit 330. The phase calibrating circuit 350 comprises a sampling unit 352 and an alignment loop state machine 354.

The clock source 310 generates a first clock signal CK1a and a second clock signal CK2a having a same frequency. The first clock signal CK1a is inputted into the first phase delay unit 320, and the phase of the first clock signal CK1a is delayed according to a first phase tuning signal T1 to generate a delayed version of the first clock signal, CK1b. Similarly, the second clock signal CK2a is inputted into the second delay unit 330, and the phase of the second clock signal CK2a is delayed according to a second phase tuning signal T2 to generate a delayed version of the second clock signal, CKb2.

The delayed first clock signal CK1b may be regarded as an LO signal inputted into the RFDAC 360.

The data circuit 340 receives the delayed second clock signal CKb2 to generate N-bit digital signals D1 to DN. That is, the N-bit digital signals D1 to DN and the delayed second clock signal CKb2 have the same frequency, and a signal edge of the N-bit digital signals D1 to DN is aligned with a signal edge of the delayed second clock signal CKb2.

The signal edges of the N-bit digital signals D1 to DN and the delayed first clock signal CK1b need to be aligned when the N-bit digital signals D1 to DN and the delayed first clock signal CK1b are inputted into the RFDAC 360. Thus, the phase calibrating circuit 350 tunes the phase of the delayed first clock signal CK1b and the delayed second clock signal CK2b, so that the signal edges of N-bit digital signals D1 to DN align with the signal edge of the delayed first clock signal CK1b.

According to one embodiment of the present invention, the phase calibrating circuit 350 receives the delayed first clock signal CK1b and an $x^{th}$-bt signal Dx in the digital signals D1 to DN, where x is any number of 1 to N.

Referring to FIG. 3A, the sampling circuit 352 receives the $x^{th}$-bit signal Dx and the delayed first clock signal CK1b, and generates a sampling signal S to the alignment loop state machine 354. The alignment loop state machine 354 changes the first phase tuning signal T1 and the second phase tuning signal T2 according to the sampling signal S, such that the phase delay circuit 315 is allowed to tune a phase relationship between the delayed first clock signal CK1b and the delayed second clock signal CK2b. When the phase difference between the delayed first clock signal CK1b and the delayed second clock signal CK2b is zero (i.e., no phase difference), i.e., the signal edges of the delayed first clock signal CK1b and the delayed second clock signal CK2b are already aligned, the phase calibrating circuit 350 stops changing the first phase tuning signal T1 and the second phase tuning signal T2.

According to the first embodiment of the present invention, the phase delay unit 320 comprises a first tuning stage 322, a second tuning stage 324 and a third tuning stage 326. The first tuning stage 322 is regarded as a coarse tuning stage having a minimum delay tuning period of approximately 50 ps (picoseconds); the second tuning stage 324 is regarded as an intermediate tuning stage having a minimum delay tuning period of approximately 10 ps; the third tuning stage 326 is regarded as a fine tuning stage having a minimum delay tuning period of approximately 3 ps. The second delay unit 330 has a same structure as that of the first delay 320, and details thereof shall be omitted herein.

Figure 3B:
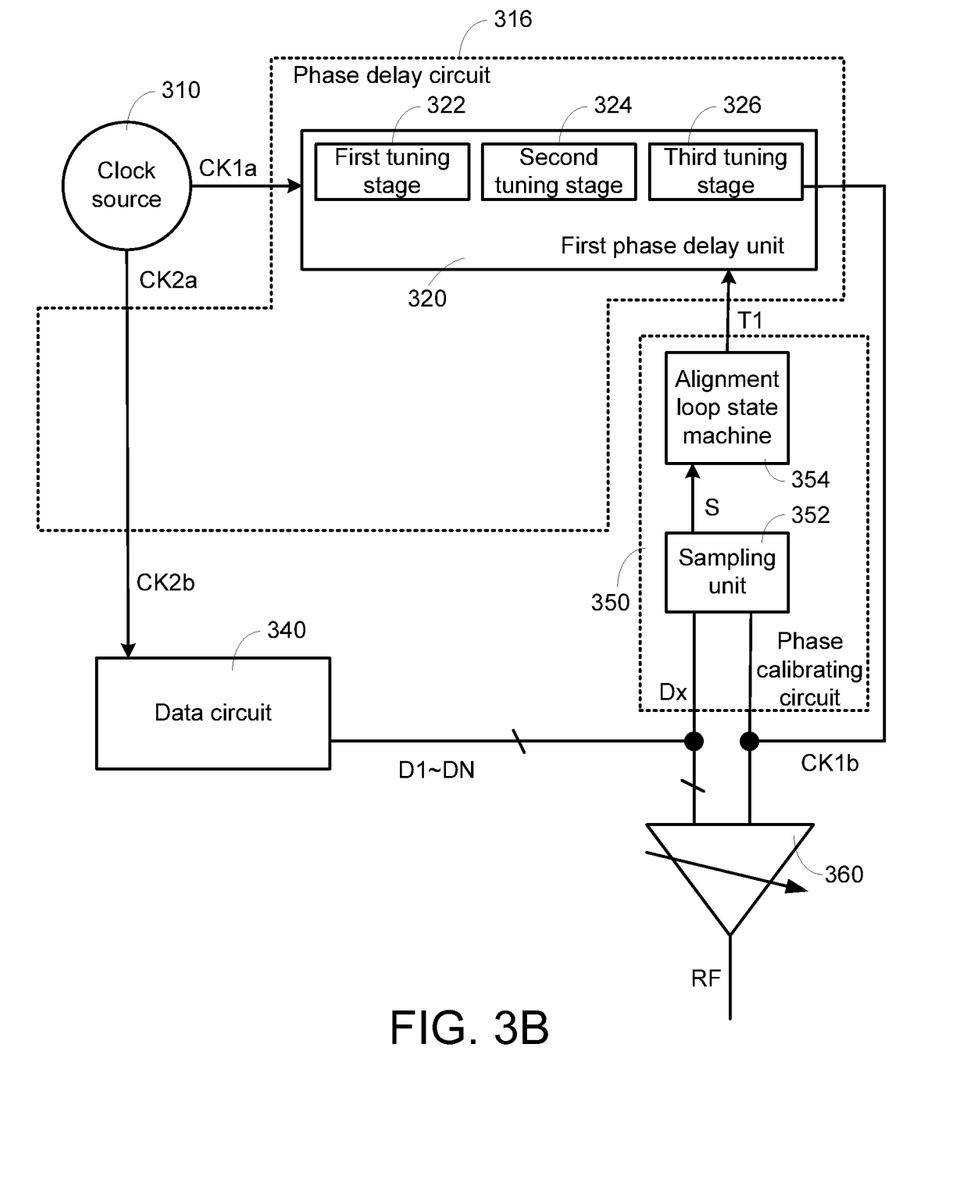

The primary objective of the present invention is tuning the phase relationship between the delayed first clock signal CK1b and the delayed second clock signal CK2b. Thus, the tuning for the phase relationship can be achieved by merely one phase delay unit. FIG. 3B shows a clock-data signal alignment apparatus according to a second embodiment of the present invention. Compared to the first embodiment, in the second embodiment, the second clock signal CK2a and the delayed second clock signal CK2b are entirely identical. That is to say, the delayed second clock signal CK2b generated by delaying the clock signal CK2a by 0 degree, or the second clock signal CK2a and the generated delayed second clock signal CK2b have the same phase. Since a phase delay circuit 316 comprises only the first delay unit 320 for controlling the phase of the first clock signal CK1a, no phase difference exists between the delayed first signal CK1b and the delayed second signal CK2b.

Figure 3C:
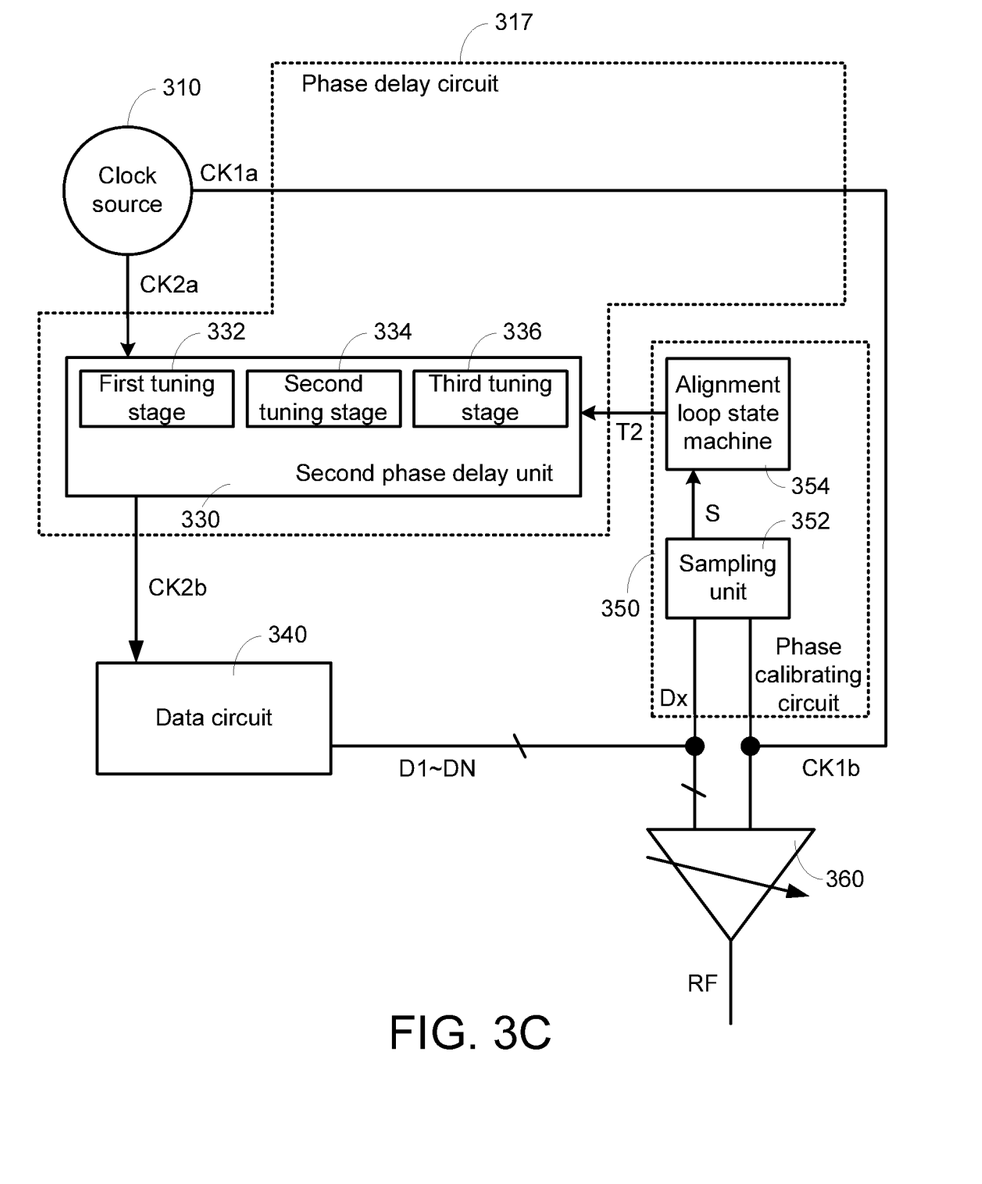

FIG. 3C shows a clock-data signal alignment apparatus according to a third embodiment of the present invention. Compared to the first embodiment, in the third embodiment, the first clock signal CK1a and the delayed first clock signal CK1b are entirely identical. That is to say, the delayed first clock signal CK1b generated by delaying the clock signal CK1a by 0 degree, or the second clock signal CK1a and the generated delayed second clock signal CK1b have the same phase. Since a phase delay circuit 317 comprises only the second delay unit 330 for controlling the phase of the second clock signal CK2a, no phase difference exists between the delayed second signal CK2b and the delayed first signal CK1b.

Figure 4A:
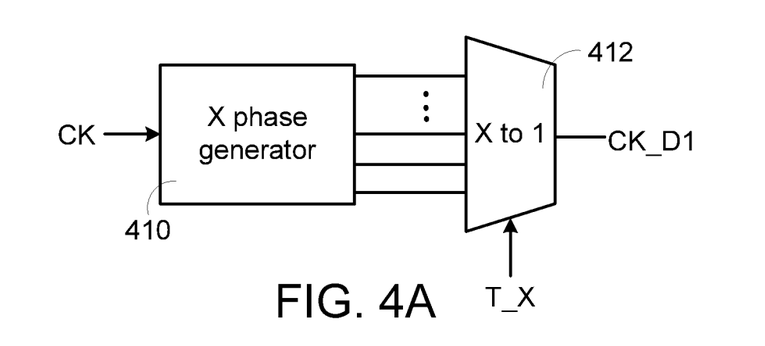
FIGS. 4A to 4D are schematic diagrams of a first tuning stage, a second tuning stage and a third tuning stage.

FIGS. 4A to 4D show schematic diagrams of a first tuning stage, a second tuning stage and a third tuning stage. The first, second and third tuning stages may be applied to the first phase delay unit 320 and the second phase delay unit 330 in the phase delay circuits 315, 316 and 317. FIG. 4A shows a schematic diagram of a tuning stage. The first tuning stage comprises an X phase generator 410 and an X-to-1 multiplexer 412. Taking X=4 for example, the X phase generator 410 receives a clock signal CK and generates four clock signals with a 90-degree phase difference from one another to the X-to-1 multiplexer 410. According to a first selection signal T_X, the X-to-1 multiplexer 412 selects one of the clock signals as a first output clock signal CK_D1. From the above description, it is known that the first selection signal T_X is 2-bit when X=4.

Figure 4B:
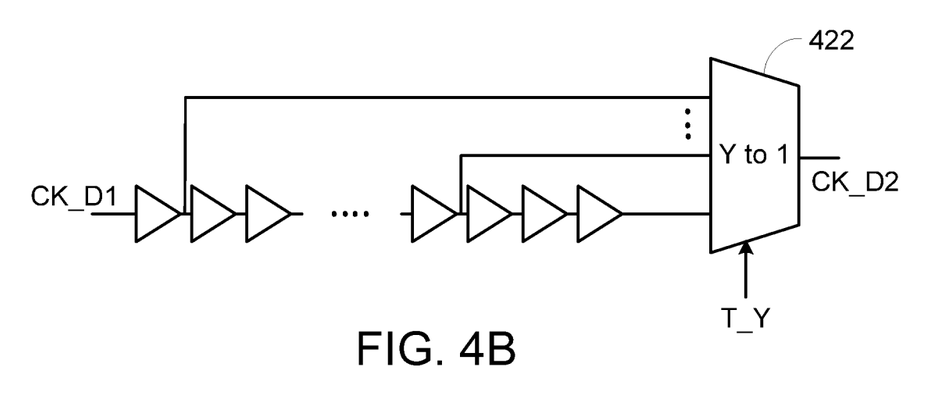

FIG. 4B shows a schematic diagram of a second tuning stage. The second tuning stage comprises a delay chain formed by multiple buffers. The delay chain has an input terminal for receiving a first clock output signal CK_D1, and further provides Y differently-phased clock signals to a Y-to-1 multiplexer 422. According to a second selection signal T_Y, the Y-to-1 multiplexer 422 selects one of the clock signals as a second output clock signal CK_D2. From the above description, it is known that the second selection signal T_Y is 4-bit when Y=16.

Figure 4C:
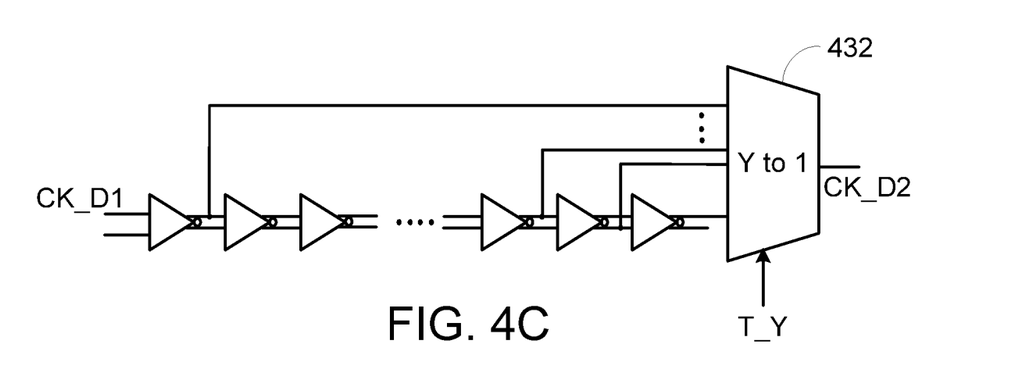

FIG. 4C shows a schematic diagram of another second tuning stage. The second tuning stage comprises a delay chain formed by multiple serially connected differential inverters. The delay chain has an input terminal for receiving a first clock output signal CK_D1, and further provides Y differently-phased clock signals to a Y-to-1 multiplexer 432. According to a second selection signal T_Y, the Y-to-1 multiplexer 432 selects one of the clock signals as a second output clock signal CK_D2. A minimum delay period of the differential inverters is approximately 10 ps.

Figure 4D:
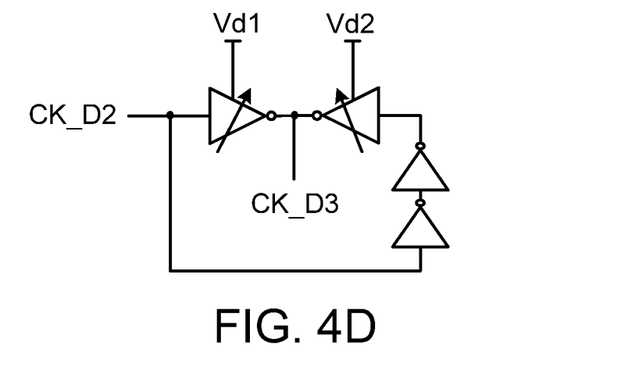

FIG. 4D shows a schematic diagram of a third tuning stage. The third tuning stage is also referred to as an interpolator. As shown in FIG. 4D, two different driving voltages Vd1 and Vd2 are provided such that delay periods of a second output clock signal CK_D2 and a third output clock signal CK_D3 reach a picosecond level. For example, four driving voltage sets are provided, with ratios between the driving voltages Vd1 and Vd2 of the four driving voltage sets being different. Thus, by using a 2-bit third selection signal, the phase difference between the second output clock signal CK_D2 and the third output clock signal CK_D3 can be tuned.

It is learned from the above descriptions that the first selection signal T_X, the second selection signal T_Y and the third selection signal add up to a total of 8 bits, which may be utilized as the first phase tuning signal T1 or the second phase tuning signal T2 outputted by the phase calibration circuit 350. In the first phase tuning signal T1 or the second phase tuning signal T2, the first two bits may control the first tuning stage, the next four bits may control the second tuning stage and the last two bits may control the third tuning stage. According to the first phase tuning signal T1, the phase of the first clock signal CK1a may be tuned to the delayed first clock signal CK1b. Similarly, according to the second phase tuning signal T2, the phase of the second clock signal CK2a may be tuned to the delayed second clock signal CK2b. As previously stated, the first selection signal T_X, the second selection signal T_Y and the third selection signal add up to a total of 8 bits, and so the minimum phase delay unit is $(360/2^8)$ degrees. That is to say, when the first selection signal T_X, the second selection signal T_Y and the third selection signal add up to a total of p bits, the minimum phase delay unit is $(360/2^p)$ degrees.

Figure 5:
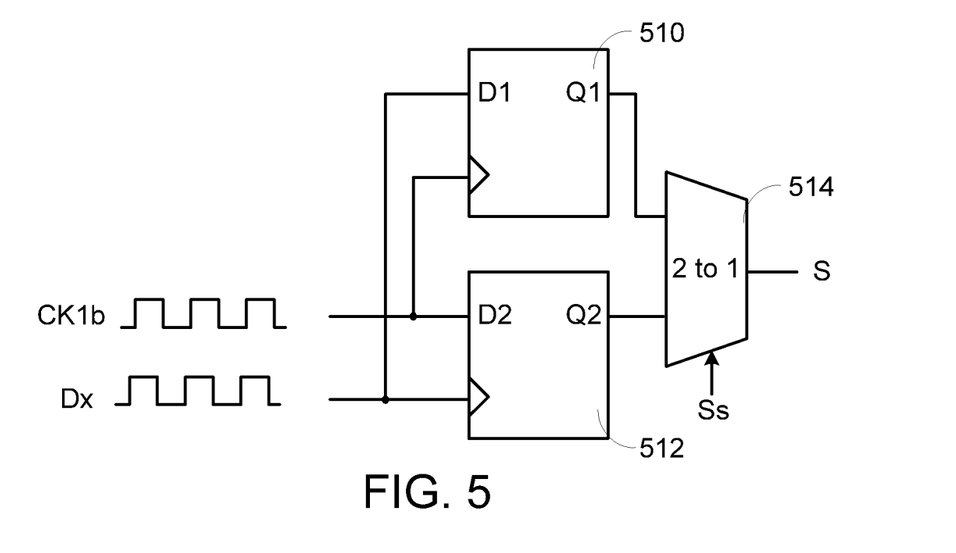
FIG. 5 is a schematic diagram of a sampling circuit.

FIG. 5 shows a schematic diagram of a sampling circuit. The sampling circuit comprises a first D-type flip-flop 510, a second D-type flip-flop 512, and a 2-to-1 multiplexer 514. During the process of signal edge alignment, the data circuit 340 needs to be controlled to output the $x^{th}$-bit signal Dx that alternates between "0" and "1", such that a square wave signal generated by the $x^{th}$-bit signal Dx and the first clock signal CK1b have the same frequency and phase.

As shown in FIG. 5, the first D-type flip-flop 510 has a data input receiving the $x^{th}$-bit signal Dx and a clock input receiving the first clock signal CK1b. That is, the delayed first clock signal CK1b serves as a sampling square wave signal, and the $x^{th}$-bit signal Dx serves as a sampled square wave signal. The second D-type flip-flop 512 has a data input receiving the delayed first clock signal CK1b and a clock input receiving the $x^{th}$-bit signal Dx. That is, the $x^{th}$-bit signal Dx serves as a sampling square wave signal, and the delayed first clock signal CK1b serves as a sampled square wave signal. The 2-to-1 multiplexer 514 is coupled to the outputs of the first D-type flip-flop 510 and the second D-type flip-flop 512, and selects one of the inputs from the first D-type flip-flop 510 and the second D-type flip-flop 512 as a sampling signal S according to a sampling selection signal Ss. In other words, the calibrating circuit may utilize the delayed first clock signal CK1b to sample the $x^{th}$-bit signal Dx to generate the sampling signal S, or may utilize the $x^{th}$-bit signal Dx to sample the delayed first clock signal CK1b to generate the sampling signal S. Further, the present invention samples the sampled square wave signal according to a rising edge of the sampling square wave signal to output the sampling signal S.

It should be noted that the sampling circuit may only employ the first D-type flip-flop 510, such that the sampling signal S is generated by sampling the $x^{th}$-bit signal Dx according to the delayed first clock signal CK1b. Alternatively, the sampling circuit may only employ the second D-type flip-flop 512, such that the sampling signal S is generated by sampling the delayed first clock signal CK1b according to the $x^{th}$-bit signal Dx.

The $x^{th}$-bit signal Dx and the delayed first clock signal CK1b have the same frequency. Therefore, when the two square wave signals are in different phases, the bitstream generated by the sampling signal S is maintained at "1" or "0". When the bitstream continues to output "1", the alignment loop state machine 354 is regarded as at a state "1". Conversely, when the bitstream continues to output "0", the alignment loop state machine 354 is regarded as at a state "0".

According to characteristics of digital circuits, a bitstream generated by the sample signal S becomes metadata when two square wave signals are in the same phase. That is to say, at this point, whether the data to be generated by the sampling signal S is "1" or "0" cannot be predicted, and may randomly become "1" or "0'. When the bitstream generated by the sampled data becomes the metadata, the alignment loop state machine 354 is regarded as at a state "2'.

Figure 6:
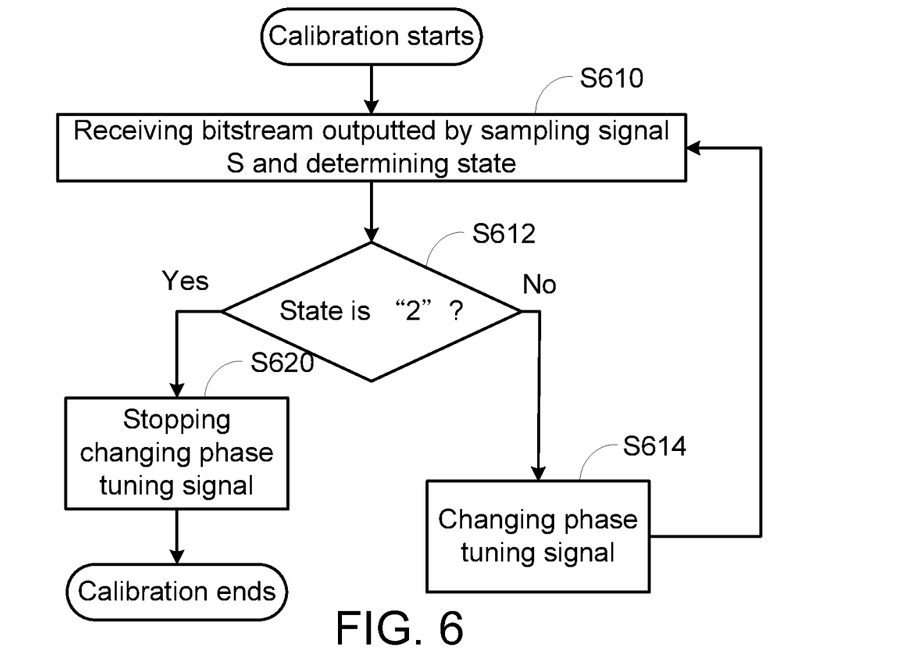
FIG. 6 is a flowchart of a signal edge alignment method according to one embodiment of the present invention.

FIG. 6 shows a flowchart of a signal edge alignment method according to one embodiment of the present invention. After the calibration process starts, in Step S610, the alignment loop state machine 354 receives a bitstream outputted by the sampling signal S and determines a state. As previously described, the state of the alignment loop state machine is "1" or "0" when two square wave signals (the $x^{th}$-bit signal Dx and the delayed first clock signal CK1b) are in difference phases. When it is determined in Step S612 that that the state is not "2", Step S614 is performed. In Step S614, the alignment loop state machine 354 needs to change a phase tuning signal (the first phase tuning signal T1 or the second phase tuning signal T2) to tune the phase difference between the two square wave signals.

After the phase tuning signal is changed, Step S610 is iterated, in which the bitstream outputted by the sampling signal S is again received. When it is confirmed in Step S612 that the state is "2", the alignment loop state machine 354 then stops changing the phase tuning signal to achieve two square wave signals adjusted to the same phase.

Many methods for the alignment loop state machine 354 to determine whether the state is "2" are available, and all determine whether the bitstream generated by the sampling signal S is the metadata. Some of the methods are described below.

In a first method, a statistical approach is adopted for determining whether data of the bitstream is metadata. For example, multiple bits (e.g., 100 bits) in the sampling signal S are successively sampled, and the number of "1" and the number of "0" in the 100 bits are counted. When an absolute difference between the two numbers is smaller than a predetermined threshold (e.g., 30), the alignment loop state machine 354 is in a state "2". The predetermined threshold can be determined as desired instead of being the above value.

In a second method, the sampling signal S is directly observed. For example, when a continuous change of "0", "1", "0" and "1" occurs in the bitstream of the sampling signal S, it is determined that the state is "2".

Figure 7A:
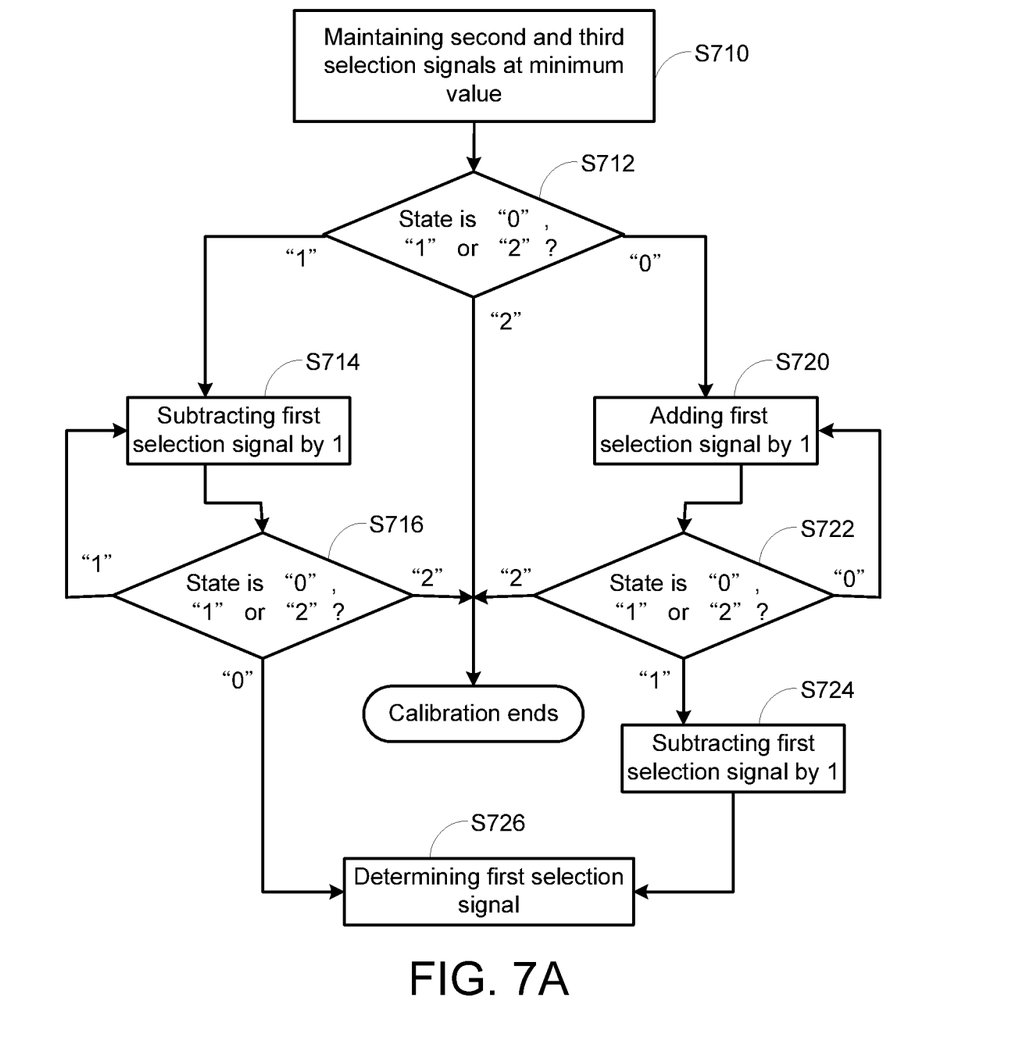
FIGS. 7A to 7C are flowcharts of a control process for a phase tuning signal in signal edge alignment method according to one embodiment of the present invention.
Figure 7B:
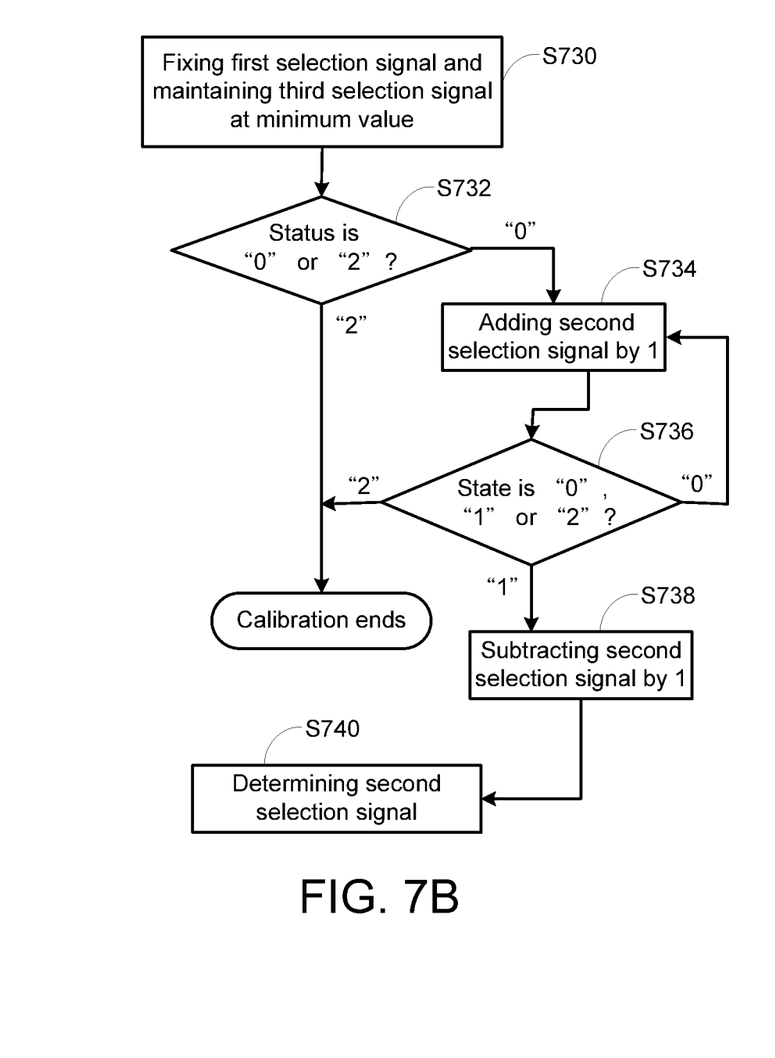
Figure 7C:
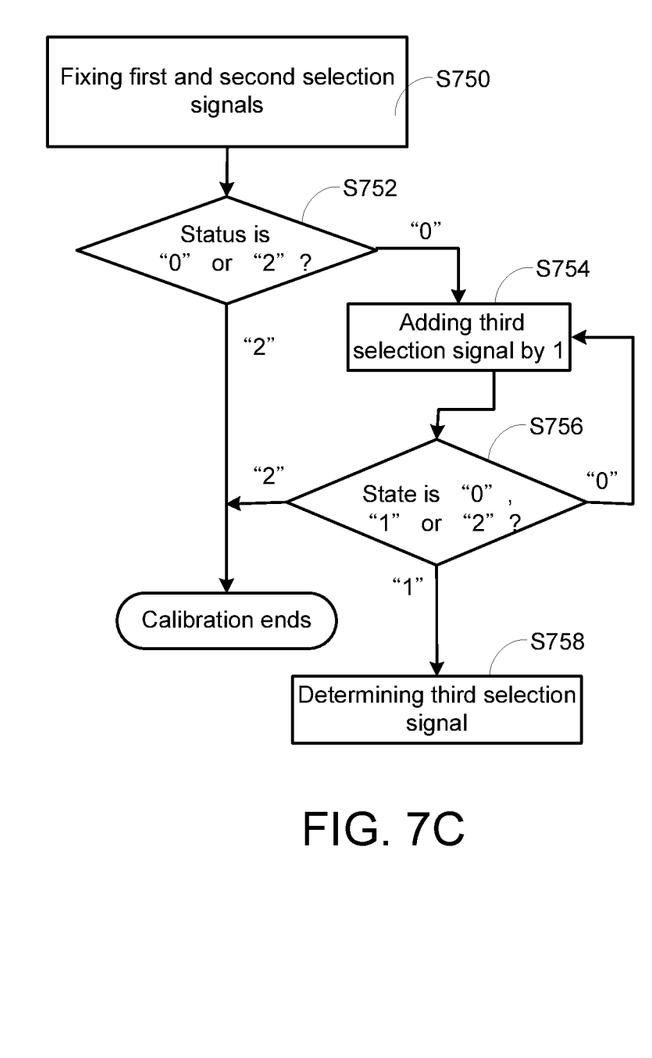

FIGS. 7A to 7C are a control process for a phase tuning signal in the edge alignment method according to one embodiment of the present invention. The embodiment is explained based on an example of adjusting a sampling square wave signal inputted into a sampling circuit. Further, a smallest delay effect is achieved when minimum values of the first, second and third selection signals in the phase adjusting signal are employed.

FIG. 7A shows a tuning method of a first tuning stage. In Step S710, the second and third selection signals are maintained at their minimum values. In Step S712, according to the sampling signal S, it is determined whether a current state is state "0", "1" or "2". The calibration process ends when it is confirmed that the state is state "2", and the current first, second and third selection signals are combined as the phase tuning signal.

When it is confirmed that it is state "1" in Step S712, the first selection signal is subtracted by 1 in Step S714, and it is determined whether the current state is a state "0", "1" or "2" in Step S716. Step S714 is iterated to further subtract the first selection signal by 1 when the current state is a state "1"; Step S726 is performed to select the first selection signal when the current state is "0"; or the calibration process ends when the current state is "2", and the current first, second and third selection signals are combined as the phase tuning signal.

When it is confirmed that the state is "0" in Step S712, the first selection signal is added by 1 in Step S720, and it is again determined whether the current status is a state "0", "1", or "2" in Step S722. Step S720 is iterated to further add the first selection signal by 1 when the current state is a state "0"; Step S724 is performed to subtract the first selection signal by 1 when the current state is "1", followed by determining the first selection signal in Step S726; or the calibration process ends when the current state is "2", and the current first, second and third selection signals are combined as the phase tuning signal.

It is known from the descriptions associated with FIG. 7A that, the above method employs the first tuning stage to tune the sampling square wave signal until the phase of the sampling square wave signal falls ahead of the phase of the sampled square wave signal (status "0"). Further, the phase difference between the sampling square wave signal and the sampled square wave signal is already smaller than the minimum tuning range of the first tuning stage.

As previously described, when it is confirmed that the phase of the sampling square wave signal falls ahead of the sampled square wave signal (i.e., when the status is "0"), the second tuning stage is employed to further tune the sampling square wave signal. FIG. 7B shows a tuning method of a second tuning stage. In Step S730, the previous first selection signal is fixed and the third selection signal is maintained at its minimum value. In Step S732, it is determined whether the current state is "0" or "2". When the state is "2", the calibration process ends, and the current first, second and third selection signals are combined as the phase tuning signal.

When it is confirmed that the state is "0" in Step S732, the second selection signal is added by 1 in Step S734, and it is again determined whether the state is "0", "1" or "2" in Step S736. Step S734 is iterated to further add the second selection signal by 1 when the state is "0"; the first selection signal is subtracted by 1 in Step S738 when the state is "1", followed by determining the second selection signal in Step S740; or the calibration process ends when the state is "2", and the current first, second and third selection signals are combined as the phase tuning signal.

It is known from the descriptions associated with FIG. 7B that, the above method employs the second tuning stage to tune the sampling square wave signal until the phase of the sampling square wave signal falls ahead of the phase of the sampled square wave signal (state "0"). Further, the phase difference between the sampling square wave signal and the sampled square wave signal is already smaller than the minimum tuning range of the second tuning stage.

After determining the first and second selection signals, the third tuning stage is employed to delay the sampling square wave signal. FIG. 7C shows a tuning method of a third tuning stage. In Step S750, the previous first and second selection signals are fixed. In Step S752, it is determined whether the state is "0" or "2" according to the sampling signal S. The calibration process ends when the state is "2", and the current first, second and third selection signals are combined as the phase tuning signal.

When it is confirmed the state is "0" in Step S752, the third selection signal is added by 1 in Step S754, and it is again determined whether the state is "0", "1" or "2" in Step S756. Step S734 is iterated to further add the second selection signal by 1 when the state is "0"; the third selection signal is determined in Step S758 when the state is "1"; or the calibration process ends when the state is "2", and the current first, second and third selection signals are combined as the phase tuning signal.

It is known from the descriptions associated with FIG. 7C that, the above method employs the third tuning stage to tune the sampling square wave signal until the phase of the sampling square wave signal falls behind the phase of the sampled square wave signal (status "1"), as well as when the phase difference between the sampling square wave signal and the sampled square wave signal is already smaller than the minimum tuning range of the third tuning stage. The final determined first, second and third selection signals are combined as the phase tuning signal.

It is demonstrated with the descriptions of FIGS. 7A to 7C that the sampling square wave signal is gradually tuned by the coarse tuning stage, the intermediate tuning stage and the fine tuning stage to obtain the minimum value of the phase difference between the sampling square wave signal and the sampled square wave signal.

It should be noted that a person skilled in the related art is not mandated to perform the tuning according to the methods in FIGS. 7A to 7C. Alternatively, the phase tuning signal may be sequentially changed from a minimum value to a maximum value, and a current state can be determined directly according to the sampling signal S. An optimal phase tuning signal is then selected from multiple phase tuning signals corresponding to the state "2". That is to say, when the phase tuning signal is p-bit, the phase tuning signal is changed from small to large such that the sampling signal S determines $2^p$ states, so as to obtain an optimal phase tuning signal.

Further, to prevent a malfunction of the edge alignment apparatus of the present invention of aligning a rising edge of a sampling signal with a falling edge of a sampled signal, two methods are provided by the present invention to prevent such malfunction of the edge alignment apparatus.

As the calibration process starts, it is possible that a rising edge of the sampling signal is coincidentally aligned with a falling edge of the sampled signal such that the state is determined as "2". At this point, the phases of the two square wave signals are first tuned to be different, followed by performing the methods from FIG. 7A to 7C for calibration to ensure that the two rising edges of the two square wave signals are aligned.

Another method provided by the present invention to prevent the above malfunction is by changing a duty cycle of one of the square wave signals. When the alignment loop state machine 354 confirms that the sampling square wave signal and the sampled square wave signal are in the same phase and determines the status as "2", the sampling method of the sampling unit 352 is further changed to change the sampling square wave signal as the sampled square wave signal and the sampled square wave signal as the sampling square wave signal.

In the event that the alignment loop state machine 354 still determines the state as "2" after changing the sampling method of the sampling unit 352, it is confirmed that the two square wave signals are in the same phase. Conversely, when the alignment loop state machine 354 determines that the state is "0" or "1" after changing the sampling method of the sampling unit 352, it is confirmed that the two square wave signals have a 180-degree phase difference, i.e., the rising edge of the sampling signal is aligned with the falling edge of the sampled signal.

It is illustrated with the embodiments that, a method and associated apparatus for clock-data signal edge alignment are provided by the present invention. The clock-data edge signal alignment method and apparatus are suitable to edge alignment of signals in the GHz level, and are capable of facilitating an RFDAC to generate highly efficient RF output signals.

Furthermore, those skilled in the art will appreciate that the several modules, functional units, etc. (collectively "components") depicted in the drawings and described herein may be implemented in hardware or software or a combination thereof. In hardware, the components may be implemented as, e.g., application specific integrated circuits (ASICs) including appropriate registers, I/O and processing functionality, and/or processors with associated memory for storing logic instructions which, when executed by the processor, perform the functions described, or any other like hardware implementation.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for signal edge alignment, comprising:
   a signal source that generates a first square wave signal and a second square wave signal;
   a phase delay circuit that receives the first square wave signal and the second square wave signal, and generates a delayed version of the first square wave signal and a delayed version of the second square wave signal according to a phase tuning signal;
   a data circuit, that generates a third square wave signal according to the delayed version of the second square wave signal; and
   a phase calibration circuit that receives the third square wave signal and the first square wave signal, and generates at the least one phase tuning signal to the phase delay circuit for tuning a phase difference between the delayed version of the first square wave signal and the delayed version of the second square wave signal, such that a signal edge of the third square wave signal aligns with a signal edge of the first square wave signal;
   wherein, the first square wave signal, the second square wave signal and the third square wave signal have a same frequency, and
   wherein the data circuit generates digital signals of a plurality of bits, and the third square wave signal is one of the digital signals, such that a radio-frequency digital-to-analog converter (RFDAC) receives the digital signals and the delayed version of the first square wave signal to generate an RF signal.

2. The apparatus according to claim 1, wherein the phase delay circuit comprises:
   a first phase delay unit that receives the first square wave signal and a first phase tuning signal to generate the delayed version of the first square wave signal; and
   a second phase delay unit that receives the second square wave signal and a second phase tuning signal to generate the delayed version of the second square wave signal.

3. The apparatus according to claim 1, wherein the second square wave signal and the delayed version of the second square wave signal are in a same phase, and the phase delay circuit comprises a first phase delay circuit for receiving the first square wave signal and the at least one phase tuning signal to generate the delayed version of the first square wave signal.

4. The apparatus according to claim 3, wherein the first phase delay unit comprises:
   a first tuning stage that receives the first square wave signal and delaying the first square wave signal according a first portion of the at least one phase tuning signal to generate a first output clock signal;
   a second tuning stage that receives the first output clock signal and delays the first output clock signal according a second portion of the at least one phase tuning signal to generate a second output clock signal; and
   a third tuning stage that receives the second output clock signal and delays the second output clock signal according to a third portion of the at least one phase tuning signal to generate the delayed version of the first square wave signal.

5. The apparatus according to claim 4, wherein the first tuning stage is a coarse tuning stage, the second tuning stage is an intermediate tuning stage, and the third tuning stage is a fine tuning stage.

6. The apparatus according to claim 1, wherein the first square wave signal and the delayed version of the first square wave signal are in a same phase, and the phase delay circuit comprises a second delay unit that receives the second square wave signal and the at least one phase tuning signal to generate the delayed version of the second square wave signal.

7. The apparatus according to claim 6, wherein the second phase delay circuit comprises:
   a first tuning stage that receives the second square wave signal and delays the second square wave signal according a first portion of the at least one phase tuning signal to generate a first output clock signal;
   a second tuning stage that receives the first output clock signal and delays the first output clock signal according a second portion of the at least one phase tuning signal to generate a second output clock signal; and
   a third tuning stage that receives the second output clock signal and delays the second output clock signal according to a third portion of the at least one phase tuning signal to generate the delayed version of the second square wave signal.

8. The apparatus according to claim 7, wherein the first tuning stage is a coarse tuning stage, the second tuning stage is an intermediate tuning stage, and the third tuning stage is a fine tuning stage.

9. The apparatus according to claim 1, wherein the phase calibration circuit comprises:
   a sampling circuit that receives the third square wave signal and the delayed version of the first square wave signal to generate a sampling signal; and
   an alignment loop state machine that receives a bitstream in the sampling signal, changes the at least one phase tuning signal when the bitstream is not metadata, and stops changing the at least one phase tuning signal when the bitstream is metadata.

10. A method for signal edge alignment, comprising:
    a) receiving a first square wave signal and a second square wave signal;
    b) generating a delayed version of the first square wave signal and a delayed version of the second square wave signal according to at least one phase tuning signal;
    c) sampling the delayed version of the second square wave signal according to the delayed version of the first square wave signal to generate a sampling signal; and
    d) changing the at least one phase tuning signal and returning to step (b) when a bitstream in the sampling signal is not metadata, and stopping changing the at least one phase tuning signal when the bitstream is metadata,
    wherein the at least one phase tuning signal comprises a first selection signal, a second selection signal and a third selection signal.

11. The method according to claim 10, wherein in a first state or in a second state, the bitstream is not metadata; and in a third state the bitstream is metadata, the step of changing the at least one phase tuning signal changes the first selection signal and comprises:
    maintaining the second selection signal and the third selection signal at a minimum value;

when in the third state, ending a process of the method;

when in the first state, sequentially increasing the first selection signal until the first selection signal corresponds to the second state, and subtracting the first selection signal by one (1) to become a determined first selection signal; or, sequentially increasing the first selection signal until the first selection signal corresponds to the third state, and ending the process; and when in the second state, sequentially decreasing the first selection signal until the first selection signal corresponds to the first state to become the determined first selection signal; or sequentially decreasing the first selection signal until the first selection signal corresponds to the third state, and ending the process;

wherein, when ending the process, the at least one phase selection signal is formed according to the first selection signal, the second selection signal and the third selection signal.

12. The method according to claim 10, wherein when it is first determined to be in the third state, changing the delayed version of the first square wave signal and the delayed version of the second square wave signal so that it is corresponding to the first state or the second state, and step (a) is again performed to prevent a malfunction.

13. The method according to claim 10, wherein:

when it is first determined as the third state, changing the delayed version of the second square wave signal and the delayed version of the first square wave signal to have different duty cycles, and sampling the delayed version of the first square wave signal according to the delayed version of the second square wave signal;

when it is confirmed that it is maintained at the first state or the second state, the malfunction is confirmed; and when it is confirmed that it is the first state or the second state, to be entered, the malfunction is confirmed.

14. The method according to claim 13, wherein the step of changing the at least one phase tuning signal changes the second selection signal and comprises:

maintaining the determined first selection signal, and maintaining the third selection signal at the minimum value;

when in the third state, ending the process; and when in the first state, sequentially increasing the second selection signal until the second selection signal corresponds to the second state, and subtracting the second selection signal by one (1) to become a determined second selection signal; or, sequentially increasing the second selection signal until the second selection signal corresponds to the third state, and ending the process;

wherein, when ending the process, the at least one phase selection signal is formed according to the first selection signal, the second selection signal and the third selection signal.

15. The method according to claim 14, wherein the step of changing the at least one phase tuning signal changes the third selection signal and comprises:

maintaining the determined first selection signal and the determined second selection signal;

when in the third state, ending the process; and when in the first state, sequentially increasing the third selection signal until the third selection signal corresponds to the second state to become a determined third selection signal; or sequentially increasing the third selection signal until the third selection signal corresponds to the third state, and ending the process;

wherein, when ending the process, the at least one phase selection signal is formed according to the first selection signal, the second selection signal and the third selection signal.

16. A method for signal edge alignment, comprising:

receiving a first square wave signal and a second square wave signal;

generating a delayed version of the first square wave signal and a delayed version of the second square wave signal according to at least one phase tuning signal;

sampling the delayed version of the second square wave signal according to the delayed version of the first square wave signal to generate a sampling signal; and determining it is a first state or a second state when a bitstream in the sampling signal is not metadata, or determining it is a third state when the bitstream is metadata;

wherein, the at least one phase tuning signal comprises p number of bits, and a plurality of third states are obtained after changing the at least one phase tuning signal $2^P$ times; and an optimal phase tuning signal is determined from a plurality of phase tuning signals corresponding to the third states.

* * * * *